United States Patent [19]

Davis et al.

[11] 4,012,588
[45] Mar. 15, 1977

[54] POSITION DETERMINING APPARATUS AND TRANSDUCER THEREFOR

[75] Inventors: Robert L. Davis, Prospect; Joseph A. Howells, Danbury, both of Conn.

[73] Assignee: Science Accessories Corporation, Southport, Conn.

[22] Filed: Aug. 29, 1975

[21] Appl. No.: 608,917

[52] U.S. Cl. .............................................. 178/18
[51] Int. Cl.² ........................................ G08C 21/00
[58] Field of Search .......... 178/18, 19, 20; 33/1 M, 33/1 P; 310/9.7

[56] References Cited

UNITED STATES PATENTS

| 3,355,603 | 11/1967 | Hesse et al. | 310/9.7 |
| 3,613,066 | 10/1971 | Cooreman | 178/18 |
| 3,692,936 | 9/1972 | Moffitt | 178/18 |
| 3,731,273 | 5/1973 | Hunt | 178/18 |
| 3,821,469 | 6/1974 | Whetstone et al. | 178/18 |
| 3,838,212 | 9/1974 | Whetstone et al. | 178/18 |

*Primary Examiner*—Thomas A. Robinson
*Attorney, Agent, or Firm*—Martin Novack

[57] ABSTRACT

An apparatus for determining the position of a movable element or stylus which is movable in a data space. In accordance with the invention there are provided first and second spaced receivers, each receiver comprising a hollow shell of piezoelectric material, which may be cylindrical or spherical in shape, and resilient conductive means coupled across the inner and outer surfaces of the shell. Means are provided for periodically generating a source of sound waves for travel between the stylus and the first and second receivers. Timing means are coupled to the receivers and synchronized with the generation of the sound waves for measuring transit time of the sound waves between the source and receivers. Computing means are employed to determine the positional coordinates of the stylus in a desired coordinate system, such as rectangular coordinates. In an embodiment of the invention the first and second receivers have conductive mesh loaded within the shell and in contact with the inner surface of the shell. In this embodiment a spring contact is coupled to the outer surface of the shell. In an embodiment of the invention the movable element or stylus is passive and means are provided for periodically generating sound waves at a source position spaced from the movable element. This eliminates the need for an "active" stylus and the problems associated therewith.

12 Claims, 4 Drawing Figures

POSITION DETERMINING APPARATUS AND TRANSDUCER THEREFOR

BACKGROUND OF THE INVENTION

This invention relates to graphical data apparatus and, more particularly, to an apparatus for locating the position of a movable element in a data space.

Graphical data systems have been employed for some time to determine the position of a movable element or stylus in a defined coordinate system. Earlier systems employed a stylus in the form of a writing pen or pointer mechanically coupled to a set of arms for translating the movement of the stylus into a sequence of usable information signals. Such arrangements proved generally unsatisfactory in that they presented undesirable frictional and inertial limitations.

Subsequently developed graphical data systems, called "digitizers," utilize tablets which have imbedded conductors. These systems, which involve the considerable expense of tablet manufacture, are satisfactory for some uses but are inflexible in that they are limited to applications where a tablet can be employed.

In the U.S. Pat. Nos. 3,838,212 and 3,731,273 there are disclosed graphical data systems which utilize a stylus that generates periodic sound waves and microphones which define a coordinate area. Circuitry is provided which measures the transit time of the sound waves between the stylus and the microphones, and the cooridinates of the stylus are determined from the transit times which are translatable to distances since the speed of sound in air is essentially a known quantity. These types of systems are presently in commercial use and offer a distinct advantage over conventional data tablets since no tablet is required and the microphones can be positioned around any desired work space. Operation is considered satisfactory but there are aspects of these types of systems which could stand improvement. For example, presently employed microphones are generally of the capacitive type which require precise uniform layered structures that are generally difficult to manufacture and are relatively fragile. When electret layers are utilized the microphones are found to have a limited life, due to leakage of trapped charge, beyond which performance can degrade. Also, the stylus in such systems is active and generally requires wire connections for energizing the sound source. In addition to the effects of the wire on manual dexterity, the sound source, typically a relatively high voltage spark, can cause electrical interference in some instances; e.g., where the data area corresponds to an electronic display like a CRT or a gas discharge display.

It is an object of the invention to provide a graphical data system which overcomes disadvantages of the prior art as set forth.

SUMMARY OF THE INVENTION

The present invention is directed to an apparatus for determining the position of a movable element or stylus which is movable in a data space. In accordance with the invention there are provided first and second spaced receivers, each receiver comprising a hollow shell of piezoelectric material, which may be cylindrical or spherical in shape, and resilient conductive means coupled across the inner and outer surfaces of the shell. Means are provided for periodically generated a source of sound waves for travel between the stylus and the first and second receivers. Timing means are coupled to the receivers and synchronized with the generation of the sound waves for measuring transit time of the sound waves between the source and receivers. Computing means are employed to determine the positional coordinates of the stylus in a desired coordinate system, such as rectangular coordinates.

In an embodiment of the invention the first and second receivers have conductive mesh loaded within the shell and in contact with the inner surface of the shell. In this embodiment a spring contact is coupled to the outer surface of the shell.

In an embodiment of the invention the movable element or stylus is passive and means are provided for periodically generated sound waves at a source position spaced from the movable element. This eliminates the need for an active stylus and the problems associated therewith.

Further features and advantages of the invention will become more readily apparent from the following detailed description when taken in conjunction with the accompanying drawings.

DESCRIPTION OF THE PREFERRED EMBODIMENT

Figure 1:
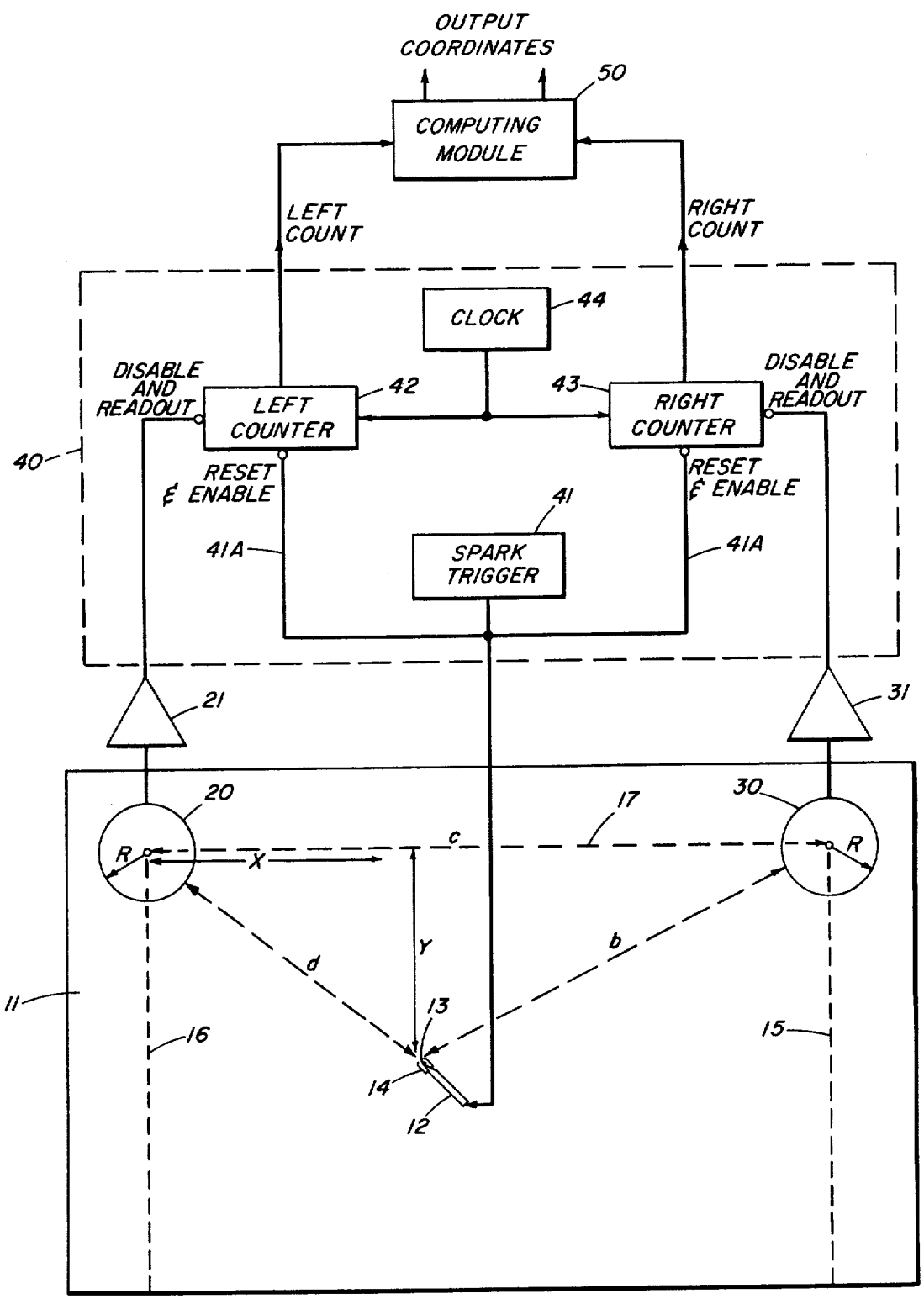
FIG. 1 is a schematic representation of a position locating apparatus in accordance with an embodiment of the invention.

In FIG. 1 a data space is generally defined by the surface area just above a generally flat surface 11, although it will become clear that the date space in accordance with the invention is not necessarily restricted and that the surface is supportive only and performs no active function in the operation of the invention. As a practical matter, the surface 11 may be a glass sheet for supporting documents for writing purposes and sufficiently transparent to enable tracings to be made, or it may be the surface of a display device upon which specific points, lines or areas are to be precisely located. A movable element of "stylus" 12, preferably in cartridge form, is movable over the surface 11 and has a tip 13 which may, for example, be a conventional ball point pen cartridge. The tip of the stylus also includes an electrode pair 14 which has a gap for producing an electrical discharge in the form of a spark. The spark is constituted by a sudden discontinuous discharge of electricity through air and produces a fast rise time sound pulse or wave radiating from the point of discharge. The spark-generating stylus is well known in the art and is described in further detail in the above-referenced U.S. Pat. No. 3,838,212.

The periodic stylus sparks are triggered by a spark trigger circuit 41 which also provides reset and enable signals to counters 42 and 43 over lines 41A. The counters count clock pulses from a clock 44. The shock wave created by the spark at the tip of stylus 12 propagates through the atmosphere until contacting transducers 20 or 30 which, in the present embodiment, are piezoelectric microphones having cylindrical surfaces. In a two-dimensional sense, the microphones 20 and 30 can be envisioned as "point" microphones since the shortest distance of travel between the stylus and the microphone surface is a line between the stylus tip and the center of the microphone. Thus, by adding a distance equal to R, the radius of the cylindrical microphones, the distance between the stylus tip and the center point of the microphones can be determined from the time duration of transit between the stylus tip and the surface of each microphone. The travel time duration is determined by circuitry 40, shown in dashed line, which comprises the left counter 42, associated with the left microphone 20, the right counter 43 associated with the right microphone 30 and the spark trigger circuit and clock 44, as already set forth. Coincident with generation of the spark, the counters 42 and 43 are enabled to begin counting pulses from clock 44. Upon initial reception of the sound wavefront, the microphones 20 and 30, which generally receive the wavefront at different times, produce output voltages which are coupled to high gain band pass amplifiers 21 and 31, respectively. The spark shock wave produces a fast rise time electrical impulse upon impinging on the microphone surface, and the band pass amplifiers allow only the fast rise time portion of the electrical pulse to pass while blocking out noise signals outside the band. To insure rapid operation, the amplifiers include threshold discriminators which provide an output pulse with steep leading edges in response to the input thereto exceeding a predetermined level. The amplifier outputs are operative to disable the counters 42 and 43 and also to read out the respective counts which are indicative of the distances between the stylus and the microphones. The readings are, of course, dependent upon the speed of sound in air which is essentially a known quantity. Since the velocity of sound in air varies with temperature, appropriate velocity compensation techniques can be employed, as known in the art, to generate suitable correction signals. These types of techniques, as well as further known refinements in the processing circuitry 40 are disclosed in the above-referenced U.S. Pat. Nos. 3,731,273 and 3,838,212.

The outputs of the counters 42 and 43 are coupled to a computing module 50 which converts the counts into desired positional coordinates, such as rectangular coordinates. For example, in FIG. 1 assume that the center of microphone 20 is the origin and that the rectangular coordinates of the stylus tip are represented by $x$ and $y$. If the distance between microphone centers is designated $c$ and the distance between the stylus tip and the outer surfaces of microphones 20 and 30 are respectively designated by $d$ and $b$ (proportional to the left and right counts), the expressions for $x$ and $y$ are:

$$x = \frac{(d+R)^2 - (b+R)^2 + c^2}{2c}$$

$$y = \sqrt{(d+R)^2 - x^2}$$

where R is the radius of the microphones. The computing module 50 may contain special purpose circuitry which forms the expressions for $x$ and $y$ using sum and difference circuits, multipliers, ratio circuits and square root circuits of known types or, if desired, may employ a programmable microprocessor chip to achieve the functions as set forth.

The dotted lines 15, 16 and 17 indicate the bounds of the area within which the stylus position is to be determined in this embodiment. Determinations outside lines 15 and 16 (e.g. with negative values of $x$ resulting from positions to the left of line 16) are readily obtained, but excessively obtuse angles tend to introduce error due to number sizing. If desired, the full area around the microphones can be made determinable, such as by providing circuitry to solve ambiguous situations in conjunction with segmentation of the microphones.

Figure 2:
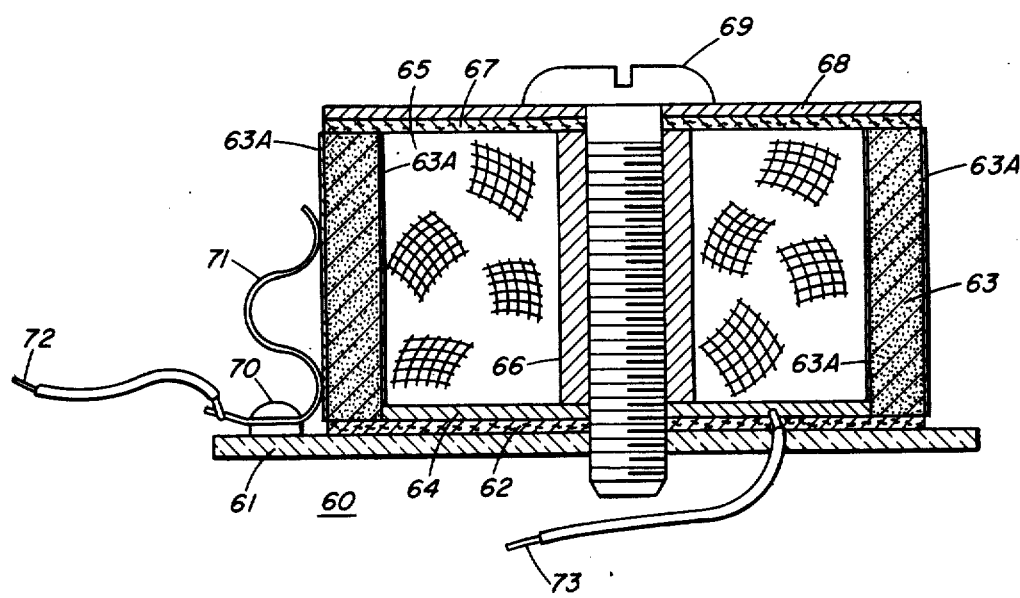
FIG. 2 is a cross sectional view of an embodiment of a transducer in accordance with the invention.
Figure 3:
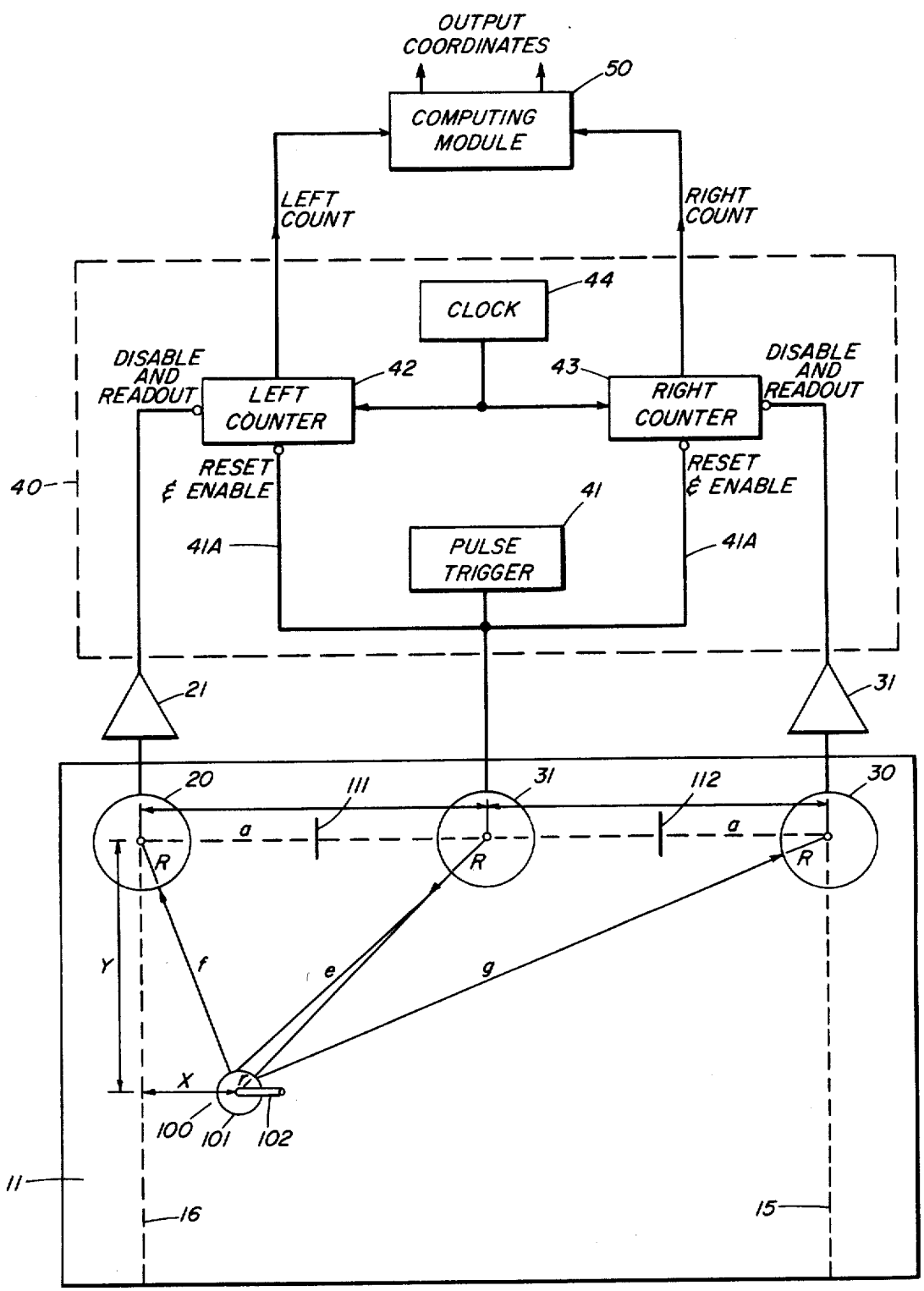
FIG. 3 is a schematic diagram, partially in block form, of a position locating apparatus in accordance with another embodiment of the invention.

Referring to FIG. 2 there is shown an embodiment of a novel transducer in accordance with the invention, the transducer being particularly suitable for use in the systems of FIGS. 1 and 3. The transducer 60 is mounted on a mounting plate 61 which, for example, may be the surface 11 of FIG. 1 or a smaller mounting plate which can be moved from place to place or adjustably mounted on a surface such as the surface 11. An isolating layer 62, which may be a felt disc having a central aperture, is provided and conforms in shape to a hollow cylinder 63 formed of piezoelectric material such as barium titanate. As used herein, the term "piezoelectric material" is intended to include any material which exhibits a piezoelectric effect; i.e., a mechanical strain resulting from the application of electricity, or vice versa. The cylinder 63, typically fabricated by counter-boring or molding, is plated with a very thin conductive layer 63A on its inner and outer surfaces. A conductive metal washer 64, also having a central aperture, is disposed over and rests upon the felt disc 62. Conductive resilient material 65, for example a wire mesh material, is loaded within the cylinder 63 and in contact with the inner surface thereof. A steel washer 66 is centrally located within the structure and another felt disc 67 and a metal disc 68, both having central apertures serve as a cover whereby a mounting bolt 69 can secure the assembly to the mounting plate 61. A small insulating support 70 has mounted therein a spring finger contact 71 which contacts the outer surface of the piezoelectric cylinder 63. Input/output terminals 72 and 73 are coupled via conductors to the contact 71 and the conductive washer 64, respectively.

In operation, the transducer 60 can serve as either a receiving microphone or a transmitter. In the receiving mode, a sound wavefront impinging on the surface of the piezoelectric cylindrical surface 63 establishes a longitudinal wave thereacross. The resilient contacts on both sides of the cylindrical surface allow free vibration while providing good electrical contact to the surfaces. The piezoelectric effect gives rise to a voltage across the material 63 which is a function of the intensity of the received wavefront, and this potential appears across terminals 72 and 73. The felt discs 62 and 67 provide isolation of the piezoelectric material above and below. The mesh 65 provides relatively uniform contact over the inner surface while being highly resilient to maintain mechanical isolation of the piezoelectric material 63. When operating as a transmitter an appropriate excitatory voltage is applied across terminals 72 and 73 and the resultant voltage across conductors 71 and mesh 65 gives rise to an acoustical wave in the piezoelectric material which is transmitted into the atmosphere.

Referring to FIG. 3, there is shown another embodiment of a position determining apparatus in accordance with the invention. A novel feature of this embodiment is that the movable element or stylus, whose position is to be determined, is passive. Specifically, movable element 100 includes a cylindrical disc 101 of radius r and a hand-held extension 102 which is pivotally mounted thereon. The bottom center of the disc 101 may be provided with a writing means, if desired, (not shown) but the movable element 100 is electrically passive and requires no electronic connections. Receiving transducers 20 and 30, which may be of the type shown in FIG. 2, are again provided as in FIG. 1 along with appropriate amplifiers 21 and 31. A third transducer 31, which serves as a transmitter, such as in the manner described in conjunction with the transmitting mode for the unit of FIG. 2, is mounted on the surface 11 equidistant from the microphones 20 and 30. A pair of acoustic barriers 111 and 112, which may be any suitable sound-absorbing material, are positioned between the transmitter 31 and the microphones 20 and 30 to prevent direct reception by the microphones of the transmitted sound waves. The electronic processing circuitry operates in similar fashion to the system of FIG. 1, except that in this case the pulse trigger 41 generates an excitatory pulse of lower voltage which is coupled to the transmitter 31.

The stylus 100 is moved over the data area and the position of the center of cylindrical disc 101 is determined by the time of travel of sound wave energy as between the surface of transmitter 31 and the surface of each of the receivers 20 and 30. Thus, the left count is substantially proportional to the sum of the distances $e$ and $f$, designated "$ef$," and the right count is substantially proportional to the sum of the distances $e$ and $g$, designated "$eg$." The rectangular coordinates of the center of cylindrical disc 101 are designated $x,y$. The center points of the transducers and movable disc 101 can be used to set forth the geometrical relationship between $x,y$ and the measured and known distances of the system. Let A represent the total path between the center of transmitter 31 and the center of microphone 20 and let B represent the total path between the center of transmitter 31 and the center of microphone 30. It follows approximately that $$A = ef + 2R + 2r \quad (1)$$

$$B = eg + 2R + 2r \quad (2)$$

where $r$ is the radius of disc 101. Using the Pythagorean theorem, it is seen that:

$$(x^2 + y^2)^{1/2} = A - [(x-a)^2 + y^2]^{1/2} \quad (3)$$

and $$[(2a-x)^2 + y^2]^{1/2} = B - [(x-a)^2 + y^2]^{1/2} \quad (4)$$

These expressions, after squaring and collecting terms, can be given as $$[(x-a)^2 + y^2]^{1/2} = \frac{A^2 - 2ax + a^2}{2A} \quad (5)$$

$$[(x-a)^2 + y^2]^{1/2} = \frac{B^2 + 2ax - 3a^2}{2B} \quad (6)$$

Equating (5) and (6) and solving for $x$ gives:

$$x = \frac{a^2(3A+B) + AB(A-B)}{2a(A+B)} \quad (7)$$

Using $x$ from (7) in equation (5) yields:

$$y = \left[\left(\frac{A^2 - 2ax + a^2}{2A}\right)^2 - (x-a)^2\right]^{1/2} \quad (8)$$

Figure 4:
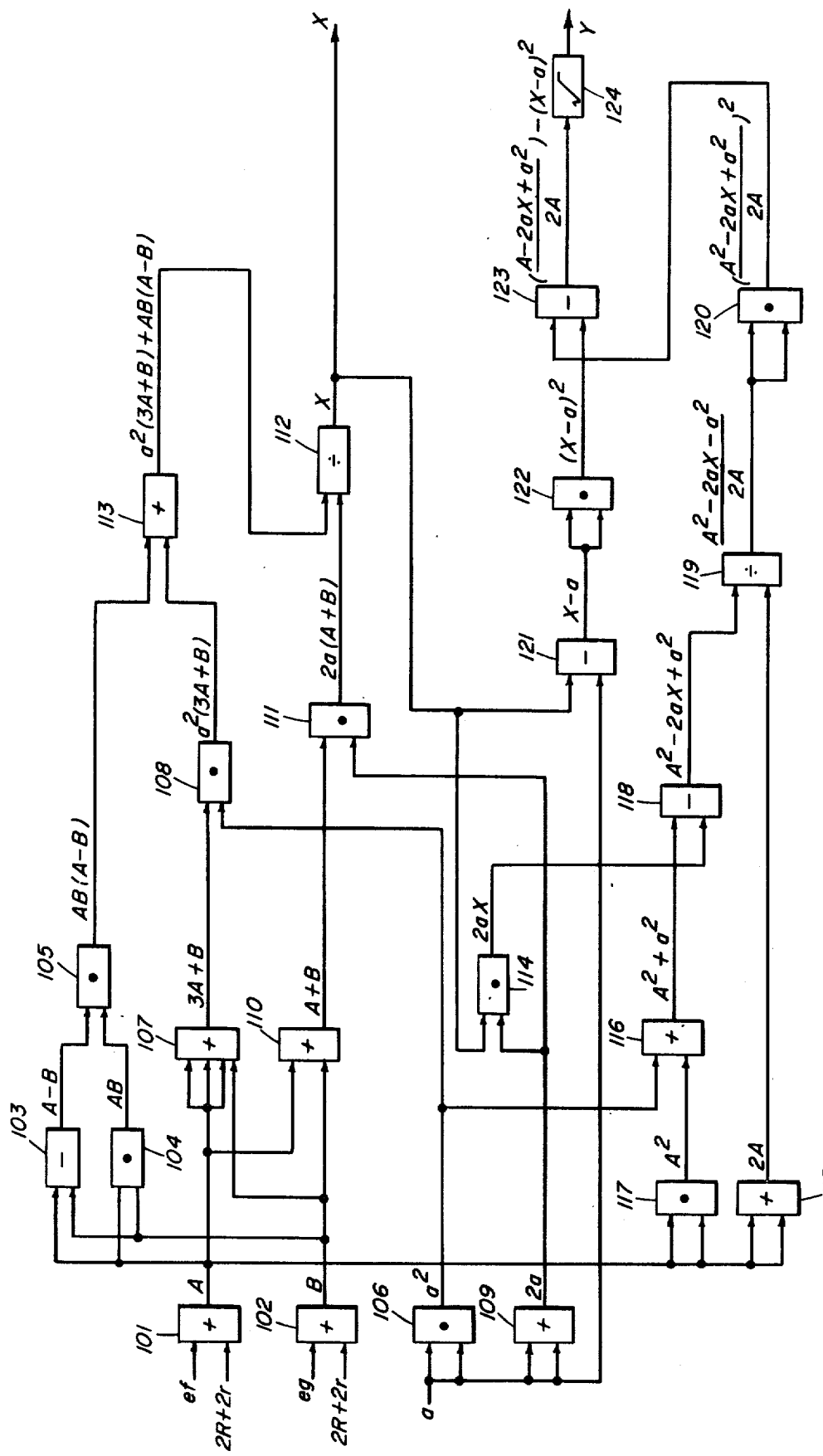
FIG. 4 is a block diagram of a computing module in accordance with the embodiment of FIG. 3.

Referring to FIG. 4 there is shown a circuit which can be utilized in the computing module 50 for obtaining the rectangular coordinates expressed by equation (7) and (8). The subsystem of FIG. 4 utilizes conventional adding circuits, difference circuits, multipliers, ratio circuits and square root circuits. It will be appreciated, however, that the computing module 150 may alternatively comprise any suitable form of digital or analog computing means or special purpose circuitry. Summing circuits 101 and 102 form the values A and B in accordance with equations (1) and (2), with ef and eg being porportional to the outputs of the left and right counters and the quantity 2R + 2r being a known quantity. The difference circuit 103, and the multipliers 104 and 105 form the quantity AB(A−B). Multiplier 106 forms the quantity $a^2$ (where $a$ is a known distance), and adder 107 and multiplier 108 form the quantity $a^2$ (3A + B). The summing circuits 109 and 110, and the multiplier 111 form the quantity 2a(A+B) and the ratio circuit 112 and summing circuit 113 form the quantity $x$; i.e., one of the desired rectangular coordinates. Multiplier 114 is utilized to form the quantity 2ax and this quantity is used in conjunction with summing circuits 115 and 116, as well as multiplier 117 difference circuit 118, and ratio circuit 119 to form the quantity ($A^2 - 2ax + a^2$)/2A. The difference circuit 121 and the multiplier 122 form the expression $(x-a)^2$ and the difference circuit 123 and square root circuit 124 are used to obtain the desired rectangular coordinate $y$.

The invention has been described with reference to particular preferred embodiments, but variations within the spirit and scope of the invention will occur to those skilled in the art. For example, the transducers in accordance with the invention can be sections of cylinders since, as shown, part of the active areas of the transducers are not utilized. Also, the transducers can be of spherical surface shape for three dimensional embodiments.

We claim:

1. Apparatus for determining the position of a movable element which is movable in a data space comprising:

first and second spaced receivers, each of said receivers comprising a curved shell of piezoelectric material having a conductive coating thereon and resilient conductive means coupled across the inner and outer surfaces of said shell;

source means for periodically generating sound waves for travel through air between said movable element and said first and second receivers;

timing means coupled to said receivers and synchronized with the generation of said sound waves for measuring the transit time of said sound waves between said source and said recievers; and computing means for translating the measured transit times to coordinates of the movable element.

2. Apparatus as defined by claim 1 wherein said first and second receivers each further comprise conductive mesh loaded within said shell and in contact with the inner surface of said shell.

3. An apparatus as defined by claim 1 wherein said curved shells are of cylindrical shape.

4. An apparatus as defined by claim 2 wherein said curved shells are of cylindrical shape.

5. An apparatus as defined by claim 1 wherein said source means is located at said movable element.

6. An apparatus as defined by claim 1 wherein said source means is generated remote from said movable element and reflects off said movable element and wherein said movable element is passive.

7. An apparatus as defined by claim 1 wherein said computing means is operative to translate the measured transit times to rectangular coordinates of the movable element.

8. An apparatus as defined by claim 6 wherein said computing means is operative to translate the measured transit times to rectangular coordinates of the movable element.

9. Apparatus for position determination in a data space, comprising:

first and second spaced receivers;

a passive movable element which is movable in said data space;

means for periodically generating sound waves at a source position spaced from said movable element; and timing means coupled to said receivers and synchronized with the generation of said sound waves for measuring the transit time of the sound waves reflected off the movable element to said receivers.

10. An apparatus as defined by claim 9 wherein said receivers are cylindrical in shape and said movable element is adapted to move in a plane perpendicular to the axes of said receivers.

11. An apparatus as defined by claim 9 further comprising computing means for translating the measured transit times to rectangular coordinates of the movable element.

12. An apparatus as defined by claim 10 further comprising computing means for translating the measured transit times to rectangular coordinates of the movable element.

* * * * *